US005491339A

United States Patent [19]
Mitsui et al.

[11] Patent Number: 5,491,339
[45] Date of Patent: Feb. 13, 1996

[54] CHARGED PARTICLE DETECTION DEVICE AND CHARGED PARTICLE RADIATION APPARATUS

[75] Inventors: Tadashi Mitsui, Wappingers Falls, N.Y.; Nozomu Harada, Yokohama, Japan; Motosuke Miyoshi, Tokyo, Japan; Makoto Sekine, Yokohama, Japan; Katsuya Okumura, Poughkeepsie, N.Y.; Haruo Okano, Tokyo, Japan

[73] Assignee: Kabushiki Kaisha Toshiba, Kawasaki, Japan

[21] Appl. No.: 308,420

[22] Filed: Sep. 19, 1994

[30] Foreign Application Priority Data

Sep. 21, 1993 [JP] Japan ................................. 5-235072

[51] Int. Cl.⁶ .............................................. H01J 37/244
[52] U.S. Cl. .................. 250/310; 250/370.14; 250/397; 257/429
[58] Field of Search ........................... 250/310, 370.14, 250/370.01, 397; 257/429, 430

[56] References Cited

U.S. PATENT DOCUMENTS

| | | | |
|---|---|---|---|
| 3,396,318 | 8/1968 | Chow | 257/430 |
| 3,472,711 | 10/1969 | Chow | 257/429 |
| 3,569,704 | 3/1971 | Mitchell | 250/370.14 |
| 4,785,186 | 11/1988 | Street et al. | 250/370.14 |
| 4,868,394 | 9/1989 | Fukuhara et al. | 250/310 |
| 4,879,466 | 11/1989 | Kitaguchi et al. | 250/370.14 |
| 4,880,976 | 11/1989 | Mancuso et al. | 250/310 |
| 4,958,079 | 9/1990 | Gray | 250/310 |
| 4,996,576 | 2/1991 | Lynch et al. | 257/429 |
| 5,117,111 | 5/1992 | Nakamura et al. | 250/310 |
| 5,122,663 | 6/1992 | Chang et al. | 250/310 |

FOREIGN PATENT DOCUMENTS

| | | | |
|---|---|---|---|
| 3-96284 | 4/1991 | Japan | 257/429 |
| 3-185865 | 9/1991 | Japan . | |

OTHER PUBLICATIONS

Soji Manabe, et al., "A 2–Million–Pixel CCD Image Sensor Overlaid with an Amorphous Silicon Photoconversion Layer," IEEE Transactions on Electron Devices, vol. 38, No. 8, pp. 1765–1771, Aug. 1991.

Primary Examiner—Bruce C. Anderson
Attorney, Agent, or Firm—Oblon, Spivak, McClelland, Maier, & Neustadt

[57] ABSTRACT

According to this invention, there is provided a charged particle detection device including a semiconductor substrate, an insulating film formed on the semiconductor substrate, an electrode formed on the insulating film, a member for forming a potential well, which is constituted by a depletion layer, near a surface of the semiconductor substrate under the electrode, a member for sweeping, into the semiconductor substrate, charges which are generated in the semiconductor substrate by charged particles incident from the electrode and are stored in the potential well, and a member for detecting signal charges generated by the charged particles swept into the semiconductor substrate.

22 Claims, 5 Drawing Sheets

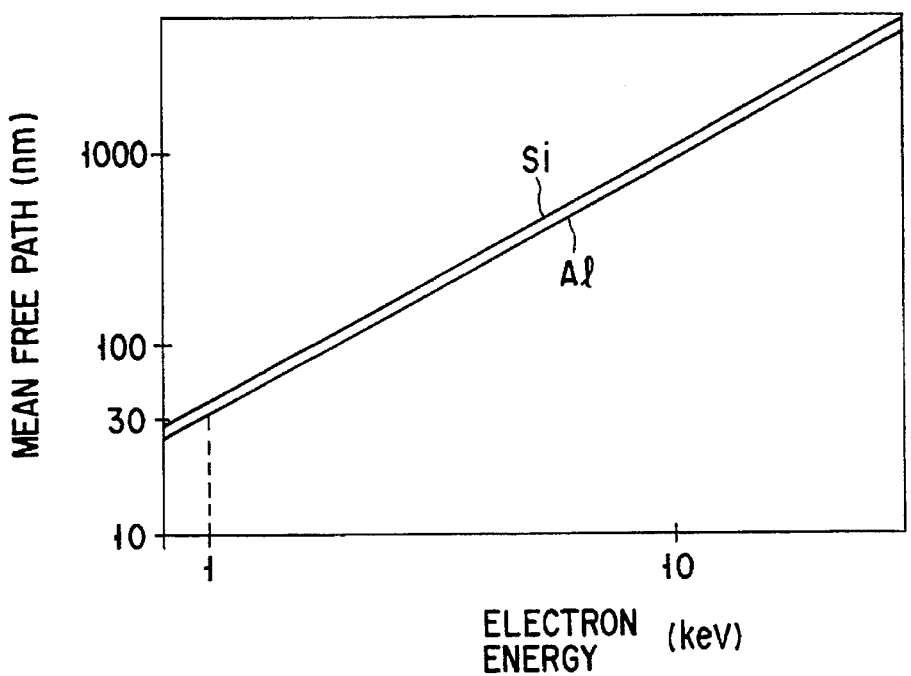
F I G. 7
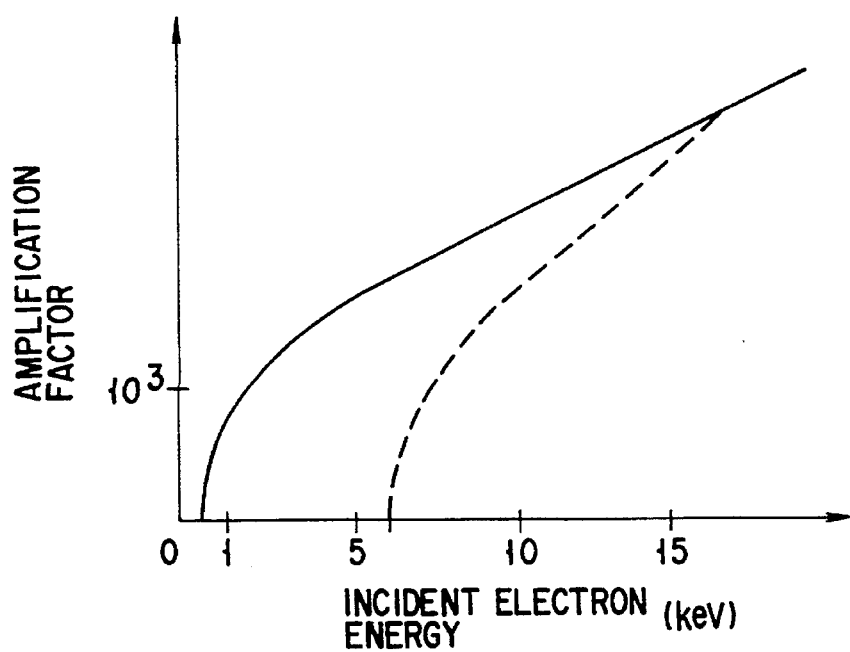
F I G. 8

CHARGED PARTICLE DETECTION DEVICE AND CHARGED PARTICLE RADIATION APPARATUS

BACKGROUND OF THE INVENTION

1. Field of the Invention

The present invention relates a charged particle detection device used in an evaluation apparatus for a semiconductor device or the like and a charged particle radiation apparatus using the charged particle detection device.

2. Description of the Related Art

In recent years, with an increase in degree of the integration density of the semiconductor device, the layout of the semiconductor device has been more finely micropatterned. For example, in a scanning electron microscope for pattern size measurement (size SEM) or the like evaluating the semiconductor, a method of evaluating a fine pattern at high accuracy must be strongly demanded. For this reason, in addition to a conventional method of detecting a secondary electron signal from a sample by a scintillator to evaluate the sample, a method in which a reflected electron signal from the sample is utilized has been developed.

A reflected electron signal is rarely affected by charge-up or contamination of a sample, and the energy dependence of the contrast of a reflected electron image is low. For this reason, evaluation can be stably performed at high accuracy using the reflected electron signal. Since reflected electrons generally have a signal amount smaller than that of secondary electrons, the performance of a size SEM or the like is in proportion to the number of reflected electrons received by a detector.

For example, FIG. 1 shows a method of using a conventional reflected electron detector. A detector 101 processed to have a thin-plate shape is arranged between an objective lens 103 of a scanning electron microscope 102 and a sample 104. An electron beam 105 from the scanning electron microscope 102 is radiated onto the sample 104 through a hole 106 formed in the central portion of the detector 101, and reflected electrons generated by the sample 104 are received by the detection surface opposing the sample 104, thereby improving the capturing yield of the reflected electrons. As a conventional reflected electron detector used in the above arrangement, a photodiode or a multi-channel plate (MCP) is used.

In an evaluation apparatus such as a scanning electron microscope (SEM) using an electron beam, it is known that a resolving power is increased by decreasing the working distance between an objective lens and a sample. For this reason, this working distance will have to be 1 mm or less in the future. Of limiting conditions of the apparatus, the thickness of a reflected electron detector is important. In this point, a photodiode which can be formed in a thin-film silicon wafer is advantageous more than an MCP whose thickness cannot be decreased without degrading the sensitivity of the detector. In addition, the photodiode is better than the MCP in stability or reliability because the photodiode does not require a high voltage and is rarely contaminated when the photodiode is exposed to the air.

The photodiode is constituted such that a $p^+$-type layer 112 and an $n^+$-type layer 113 are formed on one surface of an n-type semiconductor substrate 111 and the other surface thereof, respectively. The photodiode is a light-receiving element for generating a current or a voltage by radiating light onto a p-n junction portion formed by the n-type semiconductor substrate 111 and the $p^+$-type layer 112. This photodiode generates electron-hole pairs by radiating not only light but also high energy electrons onto the p-n junction portion. Of electron-hole pairs generated near a depletion layer 114 of the p-n junction portion or diffused to the depletion layer 114, the electrons and holes are moved to the n-type layer and the p-type layer by an internal electric field, respectively. The p-type side and the n-type side operate as positive and negative outputs, and the electrons and holes can be extracted therefrom.

However, when electrons are detected by a photodiode, unlike when light is detected by the photodiode, both reflection of incident electrons onto the surface of the photodiode and attenuation caused when the incident electrons are transmitted through the surface layer of the photodiode cannot be neglected. More specifically, since the surface layer must have a thickness of about 0.5 μm, as shown in FIG. 3, electrons having an energy of about 6 keV or less cannot be detected. On the other hand, in an evaluation apparatus using an electron beam, the acceleration energy of an electron beam conventionally used at 20 to 30 keV must be suppressed to 1 to 2 keV or less to prevent radiation damage and charge-up of a substrate. In this case, since a reflected electron energy decreases in proportion to an incident electron energy, the reflected electrons cannot be detected by a conventional photodiode.

SUMMARY OF THE INVENTION

It is an object of the present invention to provide a charged particle detection device capable of detecting, at high sensitivity, reflected electrons having a low energy, and a charged particle radiation apparatus having this charged particle detection device.

This object is achieved by a charged particle detection device comprising a semiconductor substrate, an insulating film formed on the semiconductor substrate, an electrode formed on the insulating film, means for forming a potential well, which is constituted by a depletion layer, near a surface of the semiconductor substrate under the electrode, means for sweeping, into the semiconductor substrate, charges which are generated in the semiconductor substrate by charged particles incident from the electrode and are stored in the potential well, and means for detecting signal charges generated by the charged particles swept into the semiconductor substrate.

The object is also achieved by a charged particle radiation apparatus comprising: a radiation device for radiating charged particles onto a sample; and a charged particle detection device for detecting charged particles reflected by the sample, the charged particle detection device comprising a semiconductor substrate, an insulating film formed on the semiconductor substrate, an electrode formed on the insulating film, means for forming a potential well, which is constituted by a depletion layer, near a surface of the semiconductor substrate under the electrode, means for sweeping, into the semiconductor substrate, charges which are generated in the semiconductor substrate by charged particles incident from the electrode and are stored in the potential well, and means for detecting signal charges generated by the charged particles swept into the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a graph showing the calculation result of the dependency of an electron mean free path on an incident energy;

FIG. 8 is a graph showing the dependency of an electron amplification factor obtained by a charged particle detection device according to the present invention on an incident electron energy;

DETAILED DESCRIPTION OF THE PREFERRED EMBODIMENTS

In a charged particle detection device according to the present invention, an electrode is formed on a semiconductor substrate through an insulating film, and a potential well is formed in a surface region of the semiconductor substrate. When charged particles, e.g., electrons, reflected by a sample are incident on the electrode, the electrons enter the semiconductor substrate through the electrode and the insulating film, and are stored in the potential well. The charges stored in the potential well are swept into the semiconductor substrate by applying a voltage to the semiconductor substrate or stopping the application of the voltage. The charges are detected through the electrode arranged on the semiconductor substrate.

In the charged particle detection device with the above arrangement, reflected electrons having a low energy of about 1 keV can be detected. In addition, since the thickness of the device can be set to be 1 mm or less, when the working distance between a charged particle radiation device and a sample is small, i.e., about 1 mm, the charged particle detection device can be easily installed between the charged particle radiation device and the sample. Therefore, electrons reflected by the sample can be efficiently detected.

Embodiments of the present invention will be described below in detail with reference to the accompanying drawings.

Figure 4A:
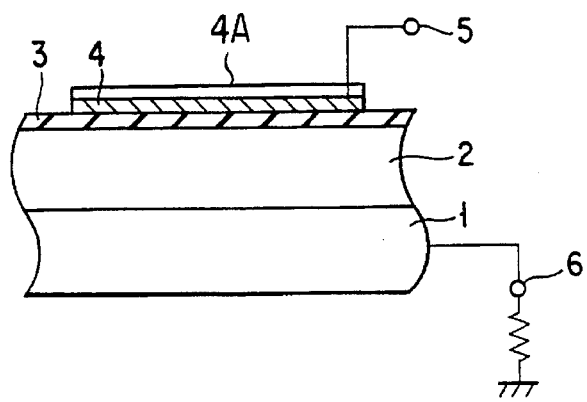
FIGS. 4A to 4D are view for explaining the operational principle of an embodiment of a charged particle detection device according to the present invention.

FIGS. 4A to 4D are views showing an embodiment of a charged particle detection device according to the present invention and the operational principle of the charged particle detection device. Referring to FIG. 4A, a $p^+$-type semiconductor layer 2 is formed in a $p^{++}$-type semiconductor substrate (silicon substrate) 1, and a thin insulating film having a thickness of about 4 nm, e.g., a silicon oxide film 3, and a thin film having a thickness of about 6 nm, e.g., an Al film 4, are formed on the $p^+$-type semiconductor layer 2, thereby constituting the charged particle detection device. An electrode terminal 5 for applying a voltage is electrically connected to the thin Al film 4, and an electrode terminal 6 for reading a signal current is electrically connected to the $p^{++}$-type substrate 1. Carbon layer 4A protects layer 4.

Figure 4B:
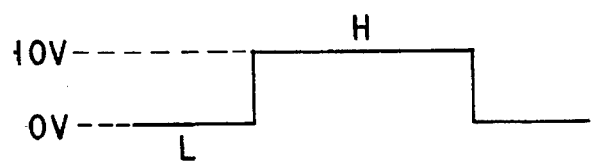
Figure 4C:
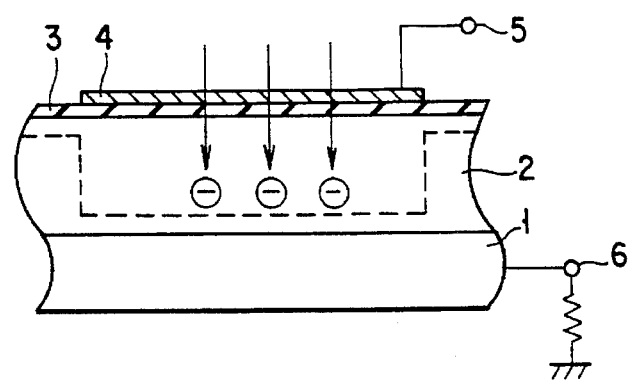
Figure 4D:
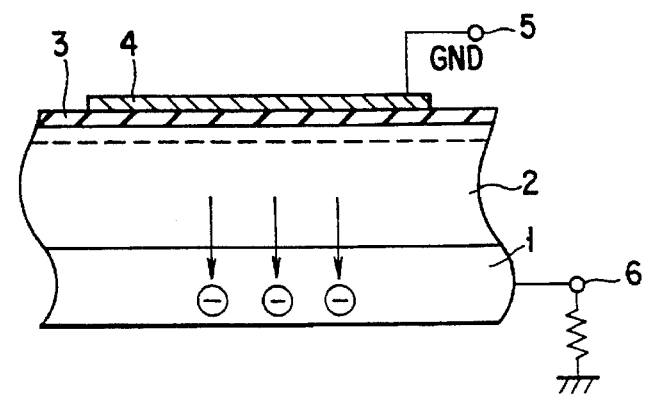

In this charged particle detection device, when a pulse voltage, for example, as shown in FIG. 4B is applied to the electrode terminal 5, a depletion layer is formed near the surface of the $p^+$-type semiconductor layer 2. In this case, the surface potential distribution of the semiconductor substrate indicated by a dotted line in FIG. 4C is obtained when charged particles, e.g., electrons are incident on the $p^+$-type semiconductor layer 2, signal charges are stored in the $p^+$-type semiconductor layer 2. In this state, when the voltage applied to the electrode terminal 5 is set to be 0 V, as shown in FIG. 4D, the surface potential distribution disappears, and the signal charges stored in the $p^+$-type semiconductor layer 2 flow into the $p^{++}$-type semiconductor substrate 1 and are detected through the electrode terminal 6.

Figure 5A:
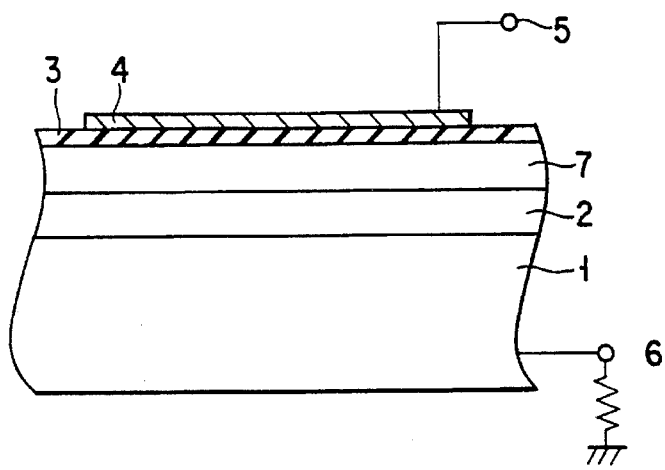
FIGS. 5A and 5B are views for explaining the operational principle of another embodiment of a charged article detection device according to the present invention.
Figure 5B:
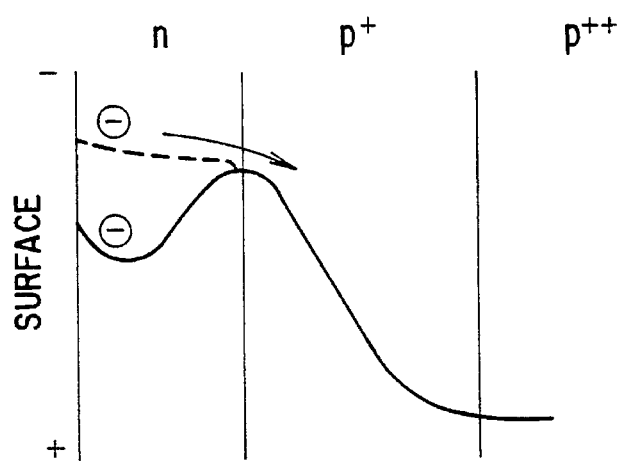

Another embodiment of a charged particle detection device according to the present invention will be described below. In the above embodiment, since the signal charges are stored in the surface of the semiconductor substrate, some signal charges are disadvantageously captured and eliminated by a recombination center at the surface. This problem, as shown in FIG. 5A, can be solved by forming an n-type semiconductor layer 7 between a $p^+$-type semiconductor layer 2 and an Al thin film 4. Therefore, as shown in FIG. 5B, signal charges are stored in the n-type semiconductor layer 7 in a semiconductor substrate when a negative voltage is applied to the Al thin film 4, the signal charges are swept into a $p^{++}$-type semiconductor substrate 1 without being captured by the recombination center at the surface.

In addition, when the n-type semiconductor layer 7 is formed between the $p^+$-type semiconductor layer 2 and a silicon oxide film 3, the thickness of the $p^+$-type semiconductor layer 2 can be decreased. For this reason, a time required to sweep the signal charges can be shortened, and the response speed of the detection device can be advantageously increased.

Figure 6:
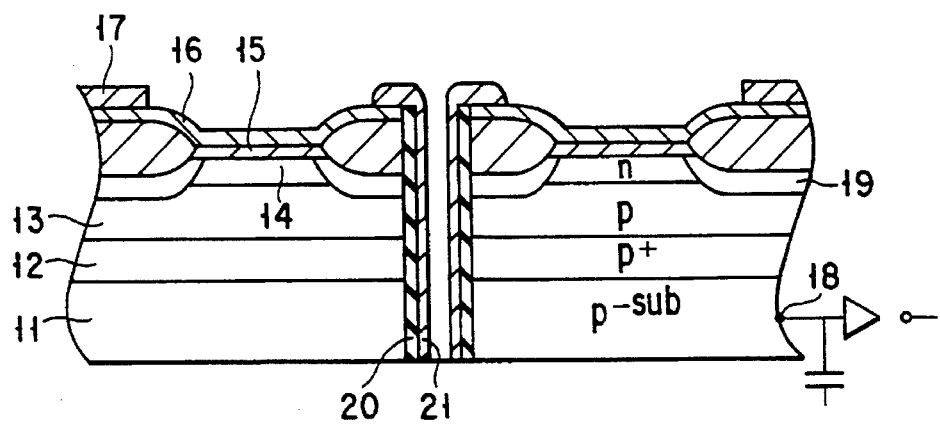
FIG. 6 is a schematic sectional view showing still another embodiment of a charged particle detection device according to the present invention.

FIG. 6 is a view showing the detailed arrangement of still another embodiment of a charged particle detection device according to the present invention. In this charged particle detection device, after a $p^+$-type semiconductor layer 12 is formed in a p-type semiconductor substrate 11, a p-type semiconductor substrate 13 having a resistivity of about 10 $\Omega$·cm is formed to have a thickness of about 10 μm, and an impurity is implanted in the resultant structure to form an n-type semiconductor layer 14 having a thickness of 0.5 to 1 μm. A thin oxide film 15 and an Al thin film 16 are formed on the uppermost surface of the resultant structure to have a total thickness of about 10 nm. An anti-inversion layer 19 is formed around the n-type semiconductor layer 14 and under an element isolation region. In this manner, the charged particle detection device (to be referred to as a detector hereinafter) is arranged.

A hole, having a diameter of 3 mm, for causing an electron beam (charged particles) to pass is formed in the central portion of the above detector. In order to prevent charge-up caused by radiation of the electron beam, a conductive thin film 21 made of gold, platium, nickel, titanium or the like is formed on the inner side of the hole through an oxide film 20. A gold pad 17 is arranged on the Al thin film 16 and around the detector, and a voltage is applied to the Al thin film 16 from an external voltage application means through a bonding wire (not shown).

A manner of detecting charged particles, e.g., reflected electrons by the above detector will be described below. Reflected electrons incident from the Al thin film 16 excite grid electrons in the semiconductor to generate electron-hole pairs, and the electron-hole pairs are stored in the n-type semiconductor layer 14. When a negative voltage is applied to the Al thin film 16, the electrons are moved to the p-type semiconductor layer by an electric field generated by the negative voltage. A terminal 18 for measuring a signal current is connected to the p-type semiconductor substrate 11. In a silicon semiconductor, an energy for generating electron-hole pairs is about 3.6 eV, and a number of electron-hole pairs is generated by causing to incident reflected electrons having an energy of several hundred electron volts to 1 keV. A larger number of electrons directly generated by incidence of the reflected electrons generate a large number of electron-hole pairs, since above electrons have an energy (>>3.6 eV) enough to generate electron-hole pairs. Therefore, finally, incident reflected electrons are greatly multiplied by repeating above process and then detected.

FIG. 7 is a graph showing the calculation result of the dependency of an electron mean free path on an incident energy when a silicon substrate and an Al thin film are used. As is apparent from FIG. 7, the mean free path of electrons having an energy of 1 keV is about 30 nm in Al. For this reason, almost the reflected electrons can be transmitted through the Al thin film 16 and the thin oxide film 15 which have a total thickness of 10 nm.

Figure 1:
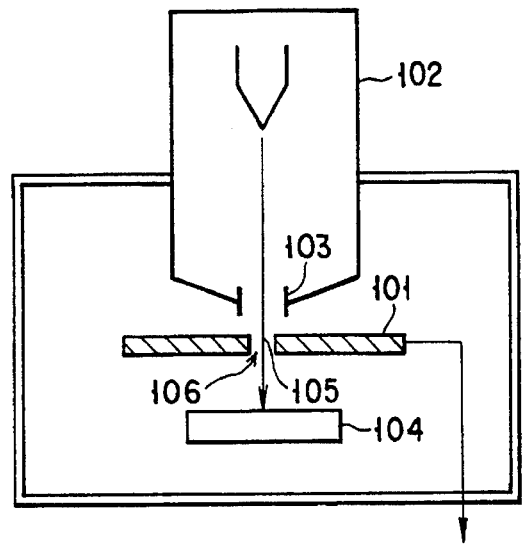
FIG. 1 is a view for explaining a method of using a conventional reflected electron detector.
Figure 2:
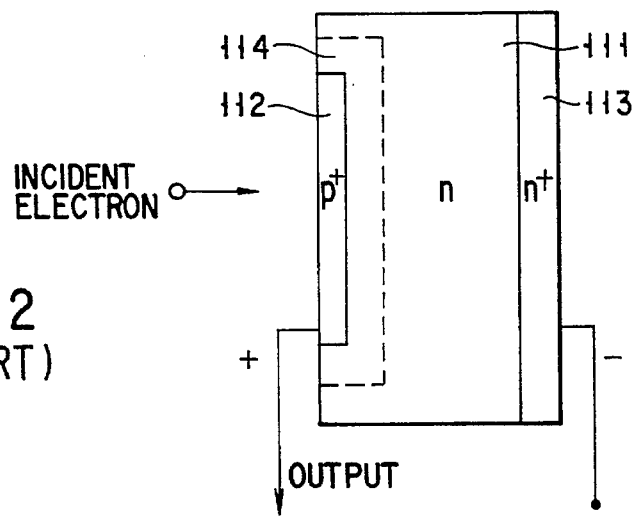
FIG. 2 is a view showing the structure of a conventional charged particle detection device using a photodiode.
Figure 3:
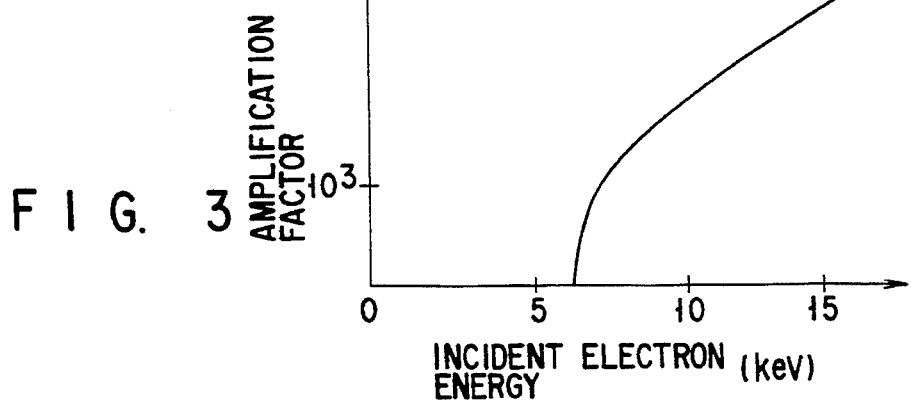
FIG. 3 is a graph showing the dependency of an electron amplification factor obtained by a conventional charged particle detection device on an incident electron energy.

FIG. 8 is a graph (solid line) showing the relationship between an incident electron energy and an amplification factor in the charged particle detection device shown in FIG. 6. As is apparent from FIG. 8, according to the charged particle detection device shown in FIG. 6, reflected electrons having a low energy, i.e., 6 keV or less, which cannot be detected by a conventional reflected electron detector using a photodiode can be detected at a high sensitivity. Note that a broken line in FIG. 8 indicates the dependency of an electron amplification factor obtained by a conventional reflected electron detector on an incident electron energy (FIG. 3).

Figure 9:
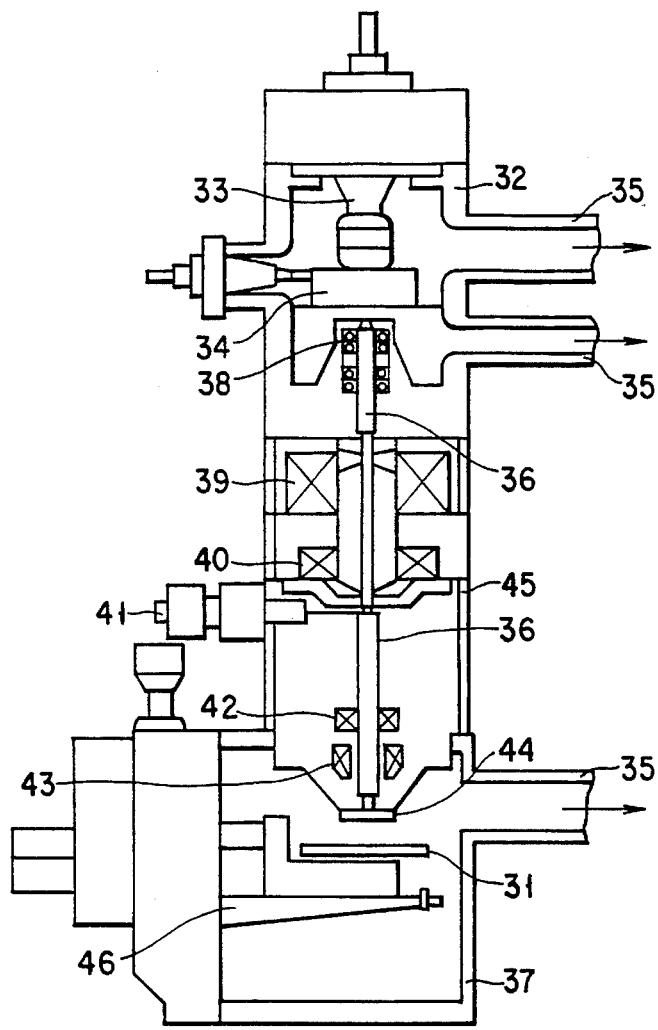
FIG. 9 is a schematic sectional view showing an embodiment of a charged particle radiation apparatus according to the present invention.

FIG. 9 is a schematic view showing an embodiment of a charged particle radiation apparatus according to the present invention. This charged particle radiation apparatus is a scanning electron microscope which can observe the reflected electron image and secondary electron image of the surface of a sample 31. Referring to FIG. 9, reference numeral 32 denotes a first chamber. A field-emitter electron gun 33 is arranged in the first chamber 32, and an extraction electrode 34 for extracting an electron beam is arranged below the electron gun 33. The first chamber 32 is evacuated from an exhaust pipe 35 connected to an exhaust means such as a vacuum pump, and the chamber 32 is set in a predetermined vacuum state. An electron beam radiated from electron gun 33 passes in a guide pipe 36 and is radiated onto the sample 31 placed in a second chamber 37.

A gun alignment 38 for aligning the optical path of an electron beam and the optical axis of an optical system is arranged outside the guide pipe 36 extending through the first chamber 32. In addition, first and second condenser lenses 39 and 40 for decreasing the diameter of an electron beam are vertically arranged in two stages. A condenser lens stop 41 is arranged below the two condenser lenses 39 and 40. A scanning coil 42 for radiating an electron beam onto a surface of the sample 31 while scanning by deflecting the electron beam is arranged below the condenser lens stop 41 and outside the guide pipe 36. An objective lens 43 is arranged below the scanning coil 42 and outside the guide pipe 36. A charged particle detection device 44 is arranged below the guide pipe 36, i.e., at the distal end portion of the optical system, to oppose the sample 31. A hole for causing an electron beam to pass is formed in the charged particle detection device 44. The two condenser lenses 39 and 40, the condenser lens stop 41, the scanning coil 42, and the objective lens 43 are accommodated in a tubular member 45 connected to the lower portion of the first chamber 32.

The second chamber 37 is connected to the lower portion of the tubular member 45. The second chamber 37 is evacuated from the exhaust pipe 35 connected to an exhaust means such as a vacuum pump, and the second chamber is set in a predetermined vacuum state. A sample stage 46 which can move the sample 31 in X-axis, Y-axis, and Z-axis directions and can rotate it in a θ direction is attached to the second chamber 37.

In the charged particle radiation apparatus with the above arrangement, an electron beam accelerated to 1 keV by the extraction electrode 34 is extracted from the electron gun 33. The extracted electron beam is decreased in diameter by the two condenser lenses 39 and 40 and deflected by the scanning coil 42. The electron beam is transmitted through the objective lens 43 and radiated onto the sample 31 through the hole of the 10 charged particle detection device 44. Some electrons radiated onto the sample 31 are elastically scattered on the surface of the sample 31 and are reflected with an energy almost equal to that of incident electrons. The reflected electrons having the low energy are efficiently captured by the charged particle (reflected electron) detection device 44. For this reason, a reflected electron image can be obtained, free from image distortion and blur caused by charges from the sample 31, as compared to a conventional secondary electron image. In addition, since the electron beam has a low energy, i.e., about 1 keV, the sample 31 is not damaged by radiating the electron beam onto the sample 31.

In this charged particle radiation apparatus, when a mesh-like electrode for receiving secondary electrons having a low energy is arranged above the charged particle detection device 44, the secondary electrons can be accelerated to an energy up to about 1 keV to be received into the charged particle detection device. Therefore, depending on a sample or target to be observed, not only a reflected electron image but also a secondary electron image can be obtained, thereby applying the present invention in a variety of fields.

Figure 10:
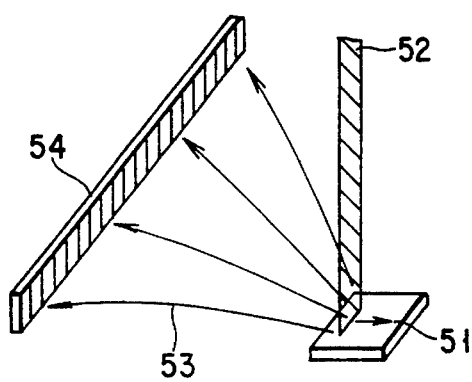
FIG. 10 is a view for explaining another embodiment of a charged particle radiation apparatus according to the present invention.

FIG. 10 is a schematic view for explaining another embodiment of a charged particle radiation apparatus according to the present invention. According to this embodiment, reflected electrons generated by a linear electron beam are captured by a linear charged particle detection device. A cathode having a linear shape is used as a cathode for emitting electrons, or field emitters for emitting electrons in the form of dots are arranged to form a linear primary electron beam 52. This linear beam 52 is radiated onto a sample 51 to be observed and scans the surface the sample 51. Reflected electrons generated at this time are received by an electron lens (not shown) arranged near the sample 51, and are efficiently captured by a charged particle detection device 54 through paths each indicated by reference numeral 53 in FIG. 10. Therefore, a reflected electron image free from image distortion or blur caused by charges from the sample 51 can be obtained. In this case, as the charged particle detection device, a plurality of charged particle detection devices each having the structure shown in FIGS. 4A to 4D are used to constitute a linear detection device.

According to the charged particle radiation apparatus with the above arrangement, since a linear beam linearly scans the surface of the sample, a time required to evaluate the sample can be made considerably shorter than that of a conventional method in which a primary beam focused on one point scans the surface of a sample. For this reason, the charged particle radiation apparatus can efficiently evaluate a sample having a large area. Since evaluation can be efficiently performed as described above, a resolving power can be increased by decreasing the scanning speed of a beam. In this case, a high throughput can be obtained. Note that, in the charged particle radiation apparatus shown in FIG. 10, although the linear charged particle detection device is constituted by connecting a plurality of charged particle detection devices, charged particle detection devices may be integrated on one substrate as in a CCD (Charge Coupled Device). In this manner, a signal process can be performed at higher speed. In addition, when each charged particle detection device is micropatterned, the resolving power of a reflected electron image can be considerably increased.

In each of the above embodiments, although an Al film is used as the thin film 4, the material of the thin film is not limited to Al in the present invention. For example, titanium nitride, chromium, carbon, silicon, or the like may be used as the material of the thin film. In addition, a carbon thin film having a resistance to acids may be coated on the surface of each thin film. In each of the above embodiments, although charged particles are detected using one charged particle detection device, a charged particle detection device may be divided into a plurality of regions, and charged particles may be detected in respective regions. Moreover, charged particles to be detected are not limited to electrons, and ions can also be detected. In this case, since ions cannot be transmitted through the electrode and the insulating film, electrons generated by incidence of the ions are directly detected.

As has been described above, according to the present invention, an electrode is formed on a semiconductor substrate through an insulating film, and a potential well is formed in a surface region of the semiconductor substrate. For this reason, charged particles, e.g., electrons, reflected by a sample enter the semiconductor substrate through the electrode and the insulating film, and are stored in the potential well. The electrons are swept into the semiconductor substrate and detected through the electrode arranged on the semiconductor substrate. For this reason, reflected electrons having a low energy of about 1 keV can be detected, and the thickness of the device can be set to be 1 mm or less. Therefore, even when the working distance between a charged particle radiation apparatus and a sample is short, i.e., about 1 mm, the charged particle detection device can be easily installed between the charged particle radiation apparatus and the sample, and electrons reflected by the sample can be efficiently detected.

Additional advantages and modifications will readily occur to those skilled in the art. Therefore, the invention in its broader aspects is not limited to 10 the specific details, and representative devices shown and described herein. Accordingly, various modifications may be made without departing from the spirit or scope of the general inventive concept as defined by the appended claims and their equivalents.

What is claimed is:

1. A charge particle detection device comprising:

a semiconductor substrate;

an insulating film formed on said semiconductor substrate;

an electrode formed on said insulating film;

means for forming a potential well, which is constituted by a depletion layer in a first region of said semiconductor substrate, near a surface of said semiconductor substrate under said electrode;

means for sweeping, into a second region of said semiconductor substrate, charges which are generated in said semiconductor substrate by charged particles incident through said electrode and that are stored in said potential well; and means for detecting electrical signals generated by the charged particles swept into said second region of said semiconductor substrate.

2. A device according to claim 1, wherein said means for forming a potential well and said means for sweeping are electrically connected to said electrode, and operate as means for applying a voltage to said electrode.

3. A device according to claim 1, wherein said electrode is made of a material selected from the group consisting of aluminum, titanium nitride, chromium, carbon, and silicon.

4. A device according to claim 1, wherein a carbon thin film is formed on a surface of said electrode.

5. A device according to claim 1, wherein a region of a conductivity type different from a conductivity type of said semiconductor substrate is formed at a position closer to said electrode than a region having said conductivity type of said semiconductor substrate.

6. A device according to claim 1, wherein said charged particles are electrons.

7. A charged particle detection device comprising:

a semiconductor substrate having a hole for causing charged particles to pass therethrough;

a first insulating film formed on said semiconductor substrate;

an electrode formed on said first insulating film;

means for forming a potential well, which is constituted by a depletion layer in a first region of said semiconductor substrate, near a surface of said semiconductor substrate under said electrode;

means for sweeping, into a second region of said semiconductor substrate, charges which are generated in said semiconductor substrate by charged particles incident through said electrode and that are stored in said potential well;

means for detecting electrical signals generated by the charged particles swept into said second region of said semiconductor substrate; and a conductive thin film formed on an inner wall of said hole through a second insulating film and electrically connected to said electrode.

8. A device according to claim 7, wherein said means for forming a potential well and said means for sweeping are electrically connected to said electrode, and operate as means for applying a voltage to said electrode.

9. A device according to claim 7, wherein a region of a conductivity type different from a conductivity type of said semiconductor substrate is formed at a position closer to said electrode than a region having said conductivity type of said semiconductor substrate.

10. A device according to claim 7, wherein said conductive thin film is made of a material selected from the group consisting of gold, platinum, nickel and titanium.

11. A charged particle radiation apparatus comprising:

a radiation device for radiating charged particles onto a sample; and a charged particle detection unit for detecting charged particles reflected by said sample, said charged particle detection comprising;

a semiconductor substrate, an insulating film formed on said semiconductor substrate, an electrode formed on said insulating film, means for forming a potential well, which is constituted by a depletion layer in a first region of said semiconductor substrate, near a surface of said semiconductor substrate under said electrode, means for sweeping, into a second region of said semiconductor substrate, charges which are generated in said semiconductor substrate by charged particles incident from said electrode and that are stored in said potential well, and means for detecting electrical signals generated by the charged particles swept into said second region of said semiconductor substrate.

12. An apparatus according to claim 11, wherein said means for forming a potential well and said means for sweeping are electrically connected to said electrode, and operate as means for applying a voltage to said electrode.

13. An apparatus according to claim 11, wherein a region of a conductivity type different from a conductivity type of said semiconductor substrate is formed at a position closer to said electrode than a region having said conductivity type of said semiconductor substrate.

14. An apparatus according to claim 11, wherein holes for causing charged particles to pass therethrough are formed in said semiconductor substrate, said insulating film, and said electrode.

15. An apparatus according to claim 14, further comprising a conductive thin film formed on inner walls of said holes through an insulating film.

16. An apparatus according to claim 11, wherein charged particles radiated onto said sample are a linear beam.

17. An apparatus according to claim 16, wherein said charged particle detection unit comprises a plurality of charged particle detection units which are linearly connected to each other.

18. An apparatus according to claim 11, said charged particles are electrons.

19. A charged particle detection device comprising:

a semiconductor substrate;

an insulating film formed on said semiconductor substrate;

an electrode formed on said insulating film;

means for forming a potential well, which is constituted by a depletion layer in a first region of said semiconductor substrate, near a surface of said semiconductor substrate under said electrode, by applying a first voltage to said electrode;

means for sweeping, into a second region of said semiconductor substrate, charges which are generated in said semiconductor substrate by electrons incident from said electrode and that are stored in said potential well, by applying a second voltage that is lower than said first voltage to said electrode; and means for detecting electrical signals generated by the electrons swept into said second region of said semiconductor substrate.

20. A device according to claim 19, wherein said electrode is made of a material selected from the group consisting of aluminum, titanium nitride, chromium, carbon, and silicon.

21. A device according to claim 19, wherein a carbon thin film is formed on a surface of said electrode.

22. A device according to claim 19, wherein a region of a conductivity type that is different from a conductivity type of said semiconductor substrate is formed at a position closer to said electrode than a region having said conductivity type of said semiconductor substrate.

* * * * *